United States Patent [19]
Jeong et al.

[11] Patent Number: 5,219,830
[45] Date of Patent: Jun. 15, 1993

[54] PROCESS FOR PREPARING HIGH-TC SUPERCONDUCTING INTEGRATED CIRCUITS

[75] Inventors: Ju Y. Jeong; I H. Song; Seok Y. Yoon; Sang C. Park, all of Seoul, Rep. of Korea

[73] Assignee: Samsung Electro-Mechanics, Suwon, Rep. of Korea

[21] Appl. No.: 731,050

[22] Filed: Jul. 15, 1991

Related U.S. Application Data

[63] Continuation-in-part of Ser. No. 640,130, Jan. 11, 1991, abandoned.

[30] Foreign Application Priority Data

Apr. 27, 1990 [KR] Rep. of Korea ............ 90-5997

[51] Int. Cl.$^5$ .............................................. B05D 5/12
[52] U.S. Cl. ............................. 505/1; 505/701; 505/742; 505/728; 427/62; 427/63; 427/96; 156/661.1; 156/653
[58] Field of Search .............. 505/1, 742, 701, 728; 427/62, 63, 299, 282, 96; 156/661.1, 653

[56] References Cited

U.S. PATENT DOCUMENTS

| | | | |
|---|---|---|---|
| 4,933,318 | 6/1990 | Heijman | 505/1 |
| 4,959,345 | 9/1990 | Yamazaki | 505/1 |
| 4,994,437 | 2/1991 | Torii et al. | 505/1 |

FOREIGN PATENT DOCUMENTS

WO89/03125  4/1989  World Int. Prop. O.

OTHER PUBLICATIONS

Yoshida et al, "Monolithic device fabrication using high-Tc superconductor" International Electron Devices Meeting (San Francisco, CA) Dec. 11-14, 1988 pp. 282-285.

Rao et al, "Oxygen Stoichiometry and Structure of $YBa_2Cu_3O_{7-\delta}$ and their relation to superconductivity", Mat. Res. Bull, vol. 23, 1988 pp. 125-131.

Primary Examiner—Shrive Beck
Assistant Examiner—Roy V. King
Attorney, Agent, or Firm—Cushman, Darby & Cushman

[57] ABSTRACT

A process for preparing high-Tc superconducting integrated circuits by using a method in which a thin surface layer of non-superconducting tetragonal $YBa_2Cu_3O_y$ wafer is selectively transformed into a superconducting orthorhombic phase by oxygen-diffusion. The superconducting orthorhombic islands are surrounded with non-superconducting tetragonal phases and these are electrically isolated from each other. The process results in the formation of superconducting integrated circuits which are inexpensive and are high in quality.

2 Claims, 3 Drawing Sheets

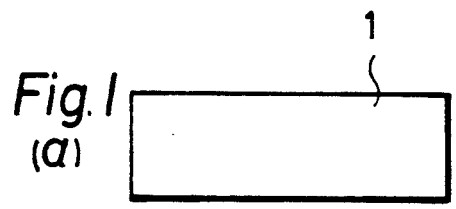
Fig. I (a)
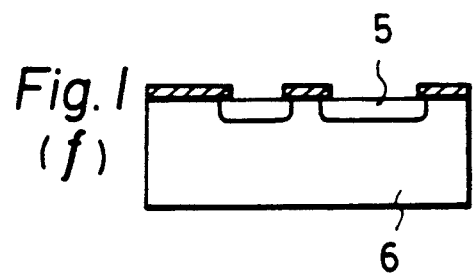
Fig. I (f)
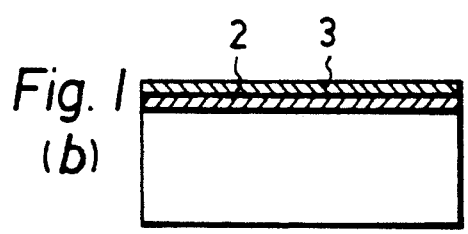
Fig. I (b)
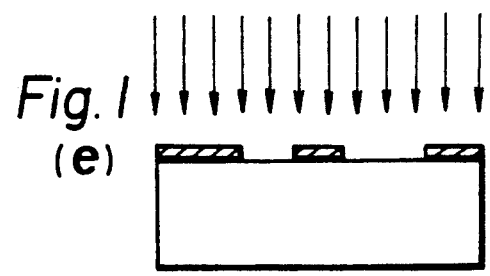
Fig. I (e)
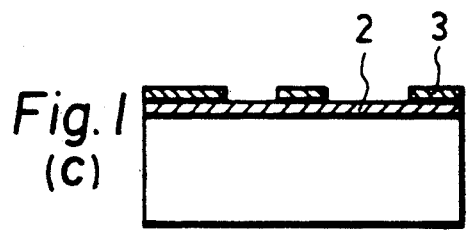
Fig. I (c)
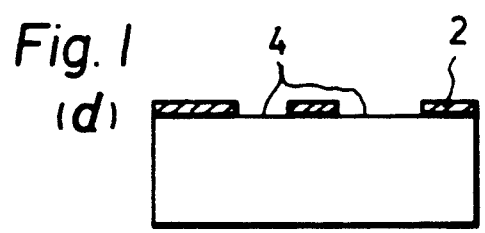
Fig. I (d)

PROCESS FOR PREPARING HIGH-TC SUPERCONDUCTING INTEGRATED CIRCUITS

BACKGROUND OF THE INVENTION

This is a continuation-in-part application Ser. No. 07/640,130, filed in Jan. 11th, 1991, now abandoned.

1. Field of the Invention

This invention is related to a process for preparing high-Tc superconducting integrated circuits, and more particularly, to the process for preparing high-Tc superconducting integrated circuits by using a non-superconducting tetragonal $YBa_2Cu_3O_y$ substrate, manufactured by a solid state method such as a partial melting process. The substrate is selectively transformed into a superconducting orthorhombic structure by oxygen diffusion. By the selective oxygenation, superconducting orthorhombic islands are surrounded with non-superconducting tetragonal phases and are electrically isolated from each other.

2. Description of the Prior Art

Conventional fabrications methods for high-Tc superconducting integrated circuits are described in the Japanese Laid Open Nos. 64-69063, 64-69064, 64-89573 and 64-89574.

In the Japanese Laid Open Nos. 64-69063 and 64-69064, above circuits are fabricated by depositing a mask layers like $SiO_2$, $Al_2O_3$ on such insulating substrates as $SrTiO_3$ or MgO single crystals, patterning the mask layer, depositing a $YBa_2Cu_3O_y$ oxide film on the whole substrate including the mask layer, and then crystallizing the oxide film by heat-treatment in an oxygen atmosphere. Only the $YBa_2Cu_3O_y$ oxide film contacting the $SrTiO_3$ or MgO substrate has high-Tc superconducting properties.

In the Japanese Laid Open Nos. 64-89573 and 64-89574, the processes for preparing above circuits are described as follows;

a) depositing a $YBa_2Cu_3O_y$ superconducting film on the $SrTiO_3$ or MgO substrate by means of magnetron sputtering;

b) forming the resist mask on the $YBa_2Cu_3O_y$ superconducting film;

c) doping selectively such ions as Ne, Ar, H, He and Si on the resist mask to destroy the crystalline structure of the orthorhombic $YBa_2Cu_3O_y$. The ion-injected portion becomes non-superconducting; and d) removing the resist mask by oxygen-plasma etching.

These methods have following problems. Firstly, because of the crystal structure difference between the film and the substrate, it is very difficult to grow a $YBa_2Cu_3O_y$ superconducting film epitaxially. Secondly, since these single crystal substrates are very expensive, it is hardly applied on a commercial scale. Also, ion-injection is not easy to put into practice.

Yamazaki discloses a high-Tc superconducting integrated circuit by selective ion implantation in Japanese Patent Laid Open No. 63-258081. This circuit is fabricated by depositing a high-Tc superconducting film on such single crystals as $SrTiO_3$ or MgO, patterning a photoresist layer, and doping selectively such ions as Si, Al, or Ga by ion implantation. The ion-doped regions have non-superconducting properties. We, inventors, do not use such single crystals as $SrTiO_3$ or MgO for substrates in our invention. Conversely, we use non-superconducting tetragonal $YBa_2Cu_3Oy$ wafers. Therefore, no lattice mismatching occurs between the film and substrate. Since ion implantation is not used in our invention, the simple oxygen diffusion makes the process of our invention easier and more economical.

A process for preparing a high-Tc superconducting device by selective UV irradiation is disclosed in Japanese Patent Laid Open No. 1-47878. The process comprises coating an Y-Ba-Cu-O oxide thick film on a glass substrate, patterning a photoresist layer, and irradiation UV lights selectively on the film in the mixed gases of $N_2O$ and $O_2$. The UV irradiation is carried out by Excimer laser. Only the UV-light irradiated regions have high-Tc superconducting properties. We inventors, do not use an UV irradiation. We use a simple oxygen diffusion so that the process of our invention can be easier, simpler and more economical. In addition, we use the non-superconducting tetragonal $YBa_2Cu_3Oy$ wafer as a substrate rather than a glass, therefore we have advantages of no lattice mismatching and little difference of thermal expansion. In our invention, coating and growing of superconducting film is not included. The superconducting film is obtained by selective oxygenation of non-superconducting tetragonal $YBa_2Cu_3Oy$ so that a better quality can be provided.

A process for preparing a high-Tc superconducting device by selective ion injection is disclosed in U.S. Pat. No. 4,959,345. This device is fabricated by depositing a very thin passivation film(blocking layer) of $Si_3N_4$, $SiO_2$, or $Al_2O_3$ on an oxide superconducting substrate by photo-CVD, injecting ions and annealing. The passivation film plays a role of blocking oxygen escape from the superconductor surface. Therefore, the device has good qualities with high content and good uniformity of oxygen. But we, inventors, do not use a photo-CVD or a ion injection. With easy oxygenation, the process of our invention is simpler and more economical. U.S. Pat. No. 4,959,345 does not teach using a film. As a result, micro-patterns cannot be made. This patent uses a passivation film which makes it very difficult to prepare a film with less than 20 Å thickness. In our invention, only specific parts of the substrate are transformed with very good control.

A process for preparing a high-Tc superconducting device by selective beam irradiation is disclosed in WO89-03125. This device is fabricated by coating an Y-Ba-Cu-O oxide thick film on a substrate like alumina, annealing in oxygen atmosphere, and by patterning non-superconducting phases by laser beam in an inert atmosphere of He, Ar, or $N_2$. This device is an integrated circuit composed of Josephson diodes. On the other hand, we do not use a laser beam irradiation. With our easy oxygenation, the process of our invention is simpler and more economical. Also, we do not coat or grow a superconducting film. Instead, we transform parts of the non-superconducting substrate into superconducting orthorhombic phase by oxygen diffusion, so a film of our invention has a better quality.

Morris et al discloses the dependence of the superconducting properties of $YB_2Cu_3O_{7-\delta}$ superconductors on the Oxygen content and thermal processing conditions in MRS, pages 209 and 213, April 1987. Beyers et al also discloses the effects of heat treatment and ambient on the structure and superconducting properties of $Y_1Ba_2Cu_3O_{9-x}$ in Appl. phys. lett 51(8) P614–616 August, 1987. Rao et al also discloses properties, microstructure and oxygen content of $YBa_2Cu_3O_{7-\delta}$ according to changes of treating temperature in Mat. Res. Bull., Vol. 23, pages 125–131, 1988.

Even though above three materials teach that it is possible to transform a non-superconducting phase into a superconducting phase by diffusing the oxygen and heat-treating the former phase, we, inventors, apply the facts as described in above materials to a high-Tc superconducting integrated circuits.

BRIEF SUMMARY OF INVENTION

Accordingly, it is the objective of the present invention to provide a process for preparing superconducting integrated circuits which can solve the problems found in the prior arts. The above objective and the novel features of the invention will more fully appear in the following detailed description when the same is read in connection with the accompanying drawings. It is to be understood, however, that the drawings are for purpose of illustration only and are not intended as a definition of the limits of the invention.

BRIEF DESCRIPTION OF FIGURES

FIGS. 1($a$), 1($b$), 1($c$), 1($d$), 1($e$) and 1($f$) are a schematic process of this invention.

DETAILED DESCRIPTION OF THE INVENTION

Figure 2:
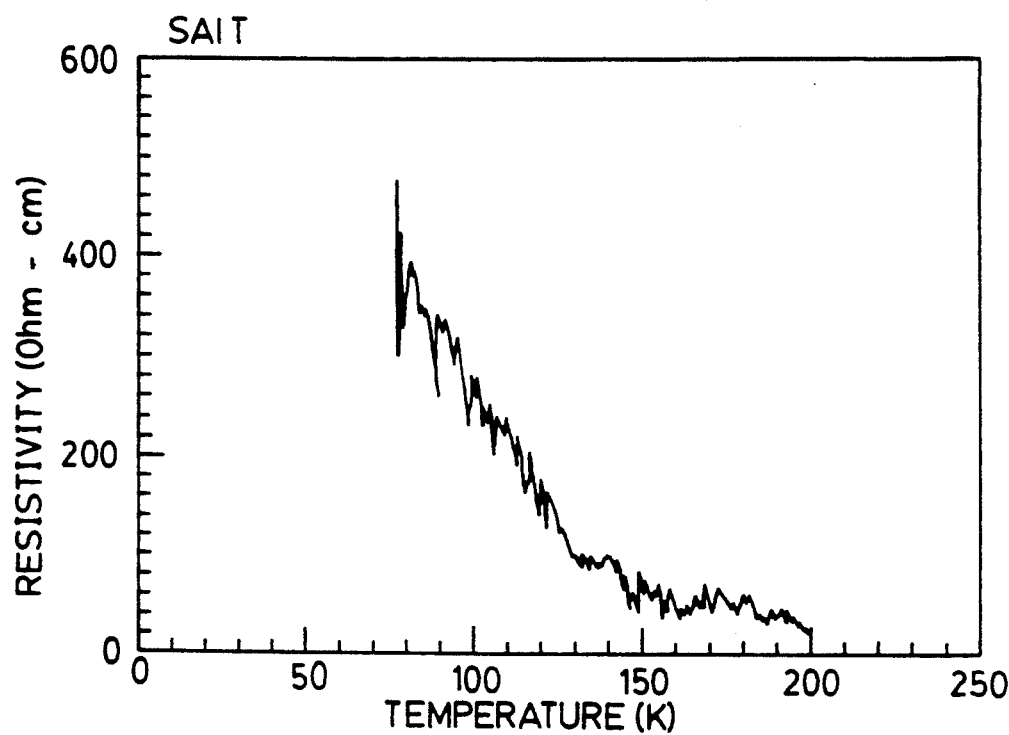
FIG. 2 is a graph of resistivity vs. temperature of the tetragonal substrate.

In this invention, a tetragonal $YBa_2Cu_3O_y(y<6.5)$ wafer is used as a substrate, the surface layer of which is selectively transformed into the superconducting orthorhombic $YBa_2Cu_3O_y(y>6.5)$ phases by oxygenation. Only the desired portions are transformed to high-Tc superconducting islands surrounded with non-superconducting tetragonal phases. The non-superconducting phase can be regarded as an insulator at the temperature at which the high-Tc superconducting phase shows the superconducting properties because the non-superconducting phase has much higher resistivity than the high-Tc superconducting phase at that temperature.

The detailed description of the present invention is introduced by referring to the drawings as follows. As stated in FIG. 1, this invention concerns a fabrication process of high-Tc superconducting integrated circuits comprising the steps of:

(a) preparing a tetragonal $YBa_2Cu_3O_y$ substrate by such methods as partial melting;

(b) polishing the tetragonal $YBa_2Cu_3O_y(y<6.5)$ substrate to form a wafer(1) of FIG. 1, if desired, the wafer may have a polished surface of 0.2 $\mu m$ roughness on the substrate;

(c) depositing an insulating mask layer(2) like $SiO_2$ or $Al_2O_3$ of about 0.2 $\mu m$ thickness on the wafer(1) by sputtering method, and coating photoresist(3) on the mask layer(2) by spin coating method (referring to FIG. 1($b$));

(d) removing the selective portions of the photoresist by using the process of photolithography (referring to FIG. 1($c$));

(e) removing the mask layer(2) on the active regions(4) by chemical etching, and then removing the photoresist (referring to FIG. 1($d$)); and (f) diffusing oxygen into the active regions(4) in environment of oxygen to transform the regions(4) into the high-Tc superconducting orthorhombic phase (referring to FIG. 1($e$) and FIG. 1($f$)), by which a number of the high-Tc superconducting islands(Tc is about 90K) become surrounded with non-superconducting tetragonal phases.

In step(c), the photoresist can be easily perceived by persons employed in the technology to which this invention belongs. For example, Shipley's positive photoresist is desirable. In step(e), various chemicals can be used depending on materials of the deposited mask layer used. For example, HF is preferable in the case of a $SiO_2$ layer.

FIG. 1($f$) is the cross sectional view of the superconducting integrated circuits fabricated by the above steps. In the figure, it can be known that thin superconducting orthorhombic islands (high-Tc superconducting phase 5) are electrically isolated from the non-superconducting substrate (tetragonal phase 6). Namely, because the high-Tc superconducting islands are surrounded with non-superconducting tetragonal phases, a superconducting island formed at a distance of two or three micrometers from other islands, they are electrically separated from each other. Therefore, the present invention can provide relatively a large number of high quality circuit elements compared with conventional methods even though such expensive single crystal substrates as $SrTiO_3$ or $MgO$ are not used. In addition, the quality of the device fabricated by this invention is better because there is no lattice-mismatching between the transformed orthorhombic layer and the substrate. Also, this invention has another big advantage over conventional processes. The conventional methods involve a direct etching of the superconductor, by which the superconducting properties of the $YBa_2Cu_3O_y$ film is degraded seriously. On the other hand, since this invention doesn't include the above direct etching process, the superconducting properties can not be affected.

The following example is included merely to aid in the understanding of the invention and variations may be made by one skilled in the art without departing from the spirit and the scope of the invention.

Stoichiometric amounts of $Y_2O_3$, $BaCO_3$ and $CuO$ were mixed for composition of Y:Ba:Cu=1:2:3. The mixed powder was milled for approximately six hours. The milled slurry was then dried in an oven at 80° C. The dried batch was calcined at 900° C. for 20 hours in air. The calcined powder was pressed at about 3 kg/cm² into pellets of 10 mm in diameter and 5 mm in thickness. In order to enhance density, the pellets were cold-isostatic pressed at about 4 kg/cm². The pressed pellets were partial-melted in air. Namely, they were heated rapidly to 1100° C. at a rate of 60° C./min, and held for 10 min. During this period some parts of the pellets melt incongruently into $Y_2BaCuO_5$ and a liquid phase. The sample was then cooled rapidly to 1010° C. and then cooled at a rate of 0.2° C./min to 940° C. During the slow cooling stage the decomposed phases react to form the 1-2-3 phase through the peritectic reaction. The sample was held at 940° C. for 10 hours and then furnace cooled at a rate of 2° C./min to room temperature. The pellets were sliced and polished to form a wafer having 0.2 $\mu m$ roughness on the surface. These $YBa_2Cu_3O_y(y<6.5)$ wafers have non-superconducting tetragonal properties. An insulating $SiO_2$ film of 0.2 $\mu m$ thickness was deposited on the polished $YBa_2Cu_3O_y(y<6.5)$ wafer by using a conventional sputtering method to form a mask layer, and then a photoresist of 1.5 μm thickness was coated on the mask layer by means of a spin coating method. A selective portion of the photoresist was removed by using a photolithography process. Using a chemical etching of HF, the selective part of the $SiO_2$ mask layer was removed. By annealing the wafer at 500° C. for 30 min in environment of $O_2$, oxygen selectively diffused into the surface of the wafer to result in an orthorhombic phase, which is a high-Tc superconducting phase, with a thickness of less than 5 micrometers. The oxygen flow rate was 2 liter/min.

FIG. 2 illustrates a resistivity vs. temperature curve for tetragonal $YBa_2Cu_3O_y(y<6.5)$ wafers, showing that the superconducting transition is not observed at temperature down to 77K. It represents a semiconductor trend.

Figure 3:
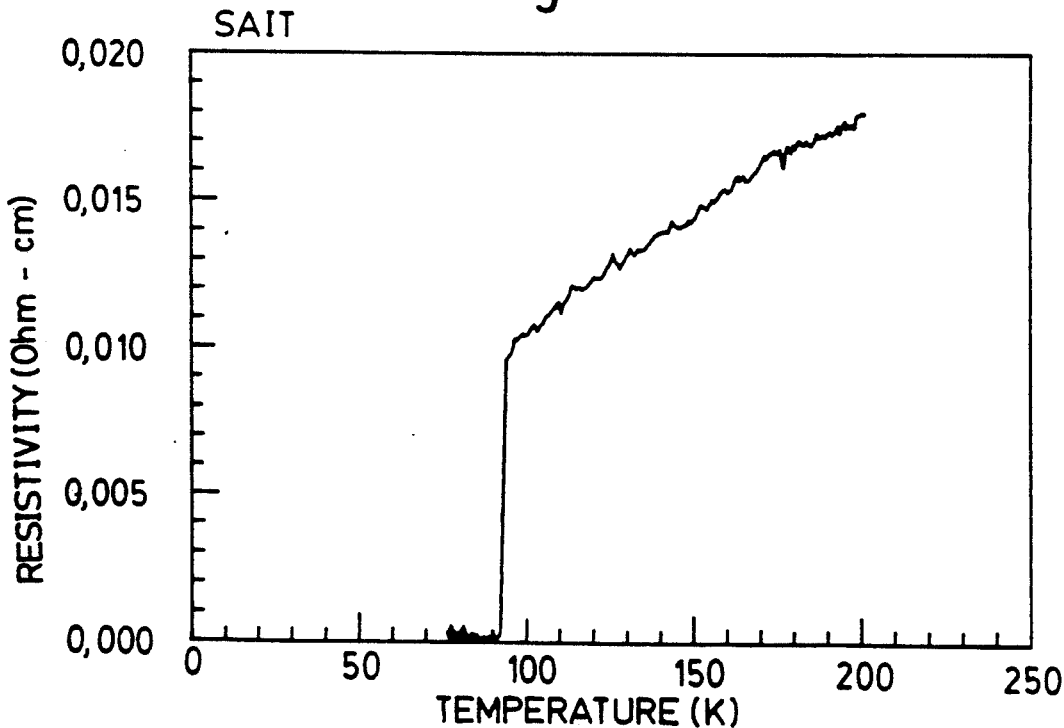
FIG. 3 is a graph of resistivity vs. temperature of the superconducting layer made by this invention.
Figure 4:
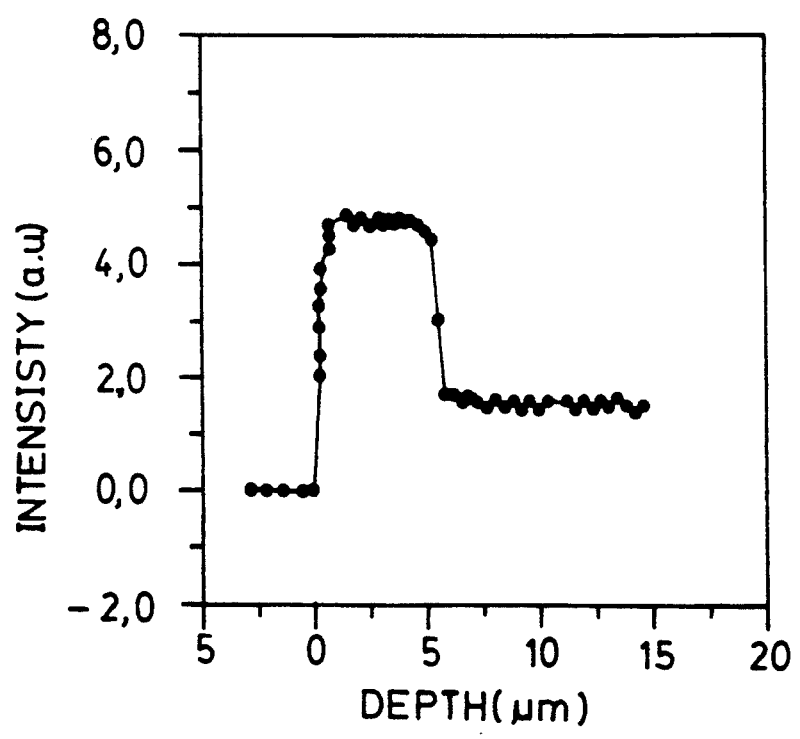
FIG. 4 is EDX(Energy Dispersive X-ray Spectroscopy) depth profiles for oxygen content in the superconducting layer made by this invention.

FIG. 3 illustrates a resistivity vs. temperature curve of the film obtained by the above oxygenation process showing that the film is superconducting at above 77K. As illustrated in FIG. 2 and FIG. 3, it can easily be recognized that the film oxygenated shows high-Tc superconducting properties, while the tetragonal $YBa_2Cu_3O_y(y<6.5)$ shows semiconducting properties at temperatures down to 77K.

Therefore, it may be concluded that the non-superconducting substrate acts as an insulator at the temperatures which high-Tc superconductor shows superconducting properties because the substrate has relatively a very high resistivity at that temperature.

What is claimed are:

1. A fabrication process of high-Tc superconducting integrated circuits comprising the steps of:
   (1) preparing a bulky tetragonal $YBa_2Cu_3O_y(y<6.5)$ wafer by partial melting wafer;
   (2) polishing a surface of the tetragonal $YBa_2Cu_3O_y$ wafer;
   (3) depositing an insulating mask layer selected from $SiO_2$ and $Al_2O_3$ on the wafer;
   (4) removing selective portions of the mask layer, defining active regions, by photolithography; and
   (5) diffusing oxygen into the active regions by annealing the wafer in an environment of oxygen to form orthorhombic high-Tc superconducting islands surrounded with non-superconducting phases.

2. The process of claim 1 wherein said orthorhombic high-Tc superconducting islands are formed to a thickness of less than 5 μm.

* * * * *